(12) United States Patent
Reif et al.

(10) Patent No.: US 7,067,909 B2
(45) Date of Patent: Jun. 27, 2006

(54) MULTI-LAYER INTEGRATED SEMICONDUCTOR STRUCTURE HAVING AN ELECTRICAL SHIELDING PORTION

(75) Inventors: Rafael Reif, Newton, MA (US); Nisha Checka, Cambridge, MA (US); Anantha Chandrakasan, Belmont, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 10/749,096

(22) Filed: Dec. 30, 2003

(65) Prior Publication Data

US 2006/0087019 A1   Apr. 27, 2006

Related U.S. Application Data

(60) Provisional application No. 60/437,549, filed on Dec. 31, 2002.

(51) Int. Cl.
*H01L 23/02* (2006.01)
(52) U.S. Cl. .................. 257/686; 257/777
(58) Field of Classification Search .......... 257/686, 257/777
See application file for complete search history.

(56) References Cited

U.S. PATENT DOCUMENTS

| | | |
|---|---|---|
| 4,313,126 A | 1/1982 | Krumm et al. |
| 4,402,761 A | 9/1983 | Feist |
| 4,456,888 A | 6/1984 | Ayasli |
| 4,599,704 A | 7/1986 | Mazin |
| 4,939,568 A | 7/1990 | Kato et al. |
| 4,986,861 A | 1/1991 | Nishida et al. |
| 5,156,997 A | 10/1992 | Kumar et al. |
| 5,206,186 A | 4/1993 | Neugebauer et al. |
| 5,236,118 A | 8/1993 | Bower et al. |
| 5,270,261 A | 12/1993 | Bertin et al. |
| 5,370,301 A | 12/1994 | Belcher et al. |
| 5,391,257 A | 2/1995 | Sullivan et al. |
| 5,445,994 A | 8/1995 | Gilton |
| 5,504,376 A | 4/1996 | Sugahara et al. |
| 5,523,628 A | 6/1996 | Williams et al. |
| 5,563,084 A | 10/1996 | Ramm et al. |
| 5,669,545 A | 9/1997 | Pham et al. |
| 5,706,578 A | 1/1998 | Hubner |
| 5,767,009 A * | 6/1998 | Yoshida et al. ............. 438/613 |
| 5,821,138 A | 10/1998 | Yamazaki et al. |
| 5,825,080 A | 10/1998 | Imaoka et al. |

(Continued)

FOREIGN PATENT DOCUMENTS

DE    100 47 963 A 1    3/2001

(Continued)

OTHER PUBLICATIONS

Y. Hayashi, Fabrication of Three Dimensional IC Using "Cumulatively Bonded IC" (CUBIC) Technology Symposium on VLSI Technology, 1990, pp. 95-96.

(Continued)

*Primary Examiner*—Douglas W Owens
(74) *Attorney, Agent, or Firm*—Daly, Crowley, Mofford & Durkee, LLP

(57) ABSTRACT

A multi-layer integrated semiconductor structure is provided, which includes at least a first semiconductor structure and a second semiconductor structure coupled together via an interface. The interface includes at least a first portion adapted to provide a communication interface between the first semiconductor structure and the second semiconductor structure and at least a second portion adapted to reduce electrical interference between the first semiconductor structure and the second semiconductor structure.

19 Claims, 7 Drawing Sheets

U.S. PATENT DOCUMENTS

| | | | |
|---|---|---|---|
| 5,902,118 | A | 5/1999 | Hubner |
| 5,904,562 | A | 5/1999 | Nulman |
| 5,923,087 | A | 7/1999 | Suzuki et al. |
| 5,940,683 | A * | 8/1999 | Holm et al. .................. 438/23 |
| 5,985,693 | A | 11/1999 | Leedy |
| 5,998,808 | A | 12/1999 | Matsushita |
| 6,027,958 | A | 2/2000 | Vu et al. |
| 6,441,478 | B1 | 8/2002 | Park |
| 6,465,892 | B1 | 10/2002 | Suga |
| 6,525,415 | B1 | 2/2003 | Koyanagi et al. |
| 6,600,173 | B1 | 7/2003 | Tiwari |
| 6,717,244 | B1 | 4/2004 | Hikita et al. |
| 2002/0050635 | A1 | 5/2002 | Ogura et al. |
| 2002/0074670 | A1 | 6/2002 | Suga |
| 2002/0109236 | A1 | 8/2002 | Kim et al. |
| 2002/0135062 | A1 | 9/2002 | Mastromatteo et al. |
| 2002/0135075 | A1 | 9/2002 | Leedy |
| 2004/0124538 | A1 | 7/2004 | Reif et al. |
| 2004/0126994 | A1 | 7/2004 | Reif et al. |
| 2004/0219765 | A1 | 11/2004 | Reif et al. |

FOREIGN PATENT DOCUMENTS

| | | |
|---|---|---|
| EP | 1 041 624 A1 | 10/2000 |
| EP | 1 151 962 A1 | 7/2001 |
| EP | 1 151 962 A1 | 11/2001 |
| EP | 1 432 032 A2 | 6/2004 |
| FR | 2 645 681 | 4/1989 |
| WO | WO 02/09182 A1 | 1/2002 |

OTHER PUBLICATIONS

Osamu Tabata, Anisotropic Etching of Silicon In TMAH Solutions, Toyota Central Research and Development Laboratories, Inc., Feb. 21, 1992, pp. 51-57, Japan.

Philip M. Sailer, Creating 3D Circuits Using Transferred Films, Cicuits & Devices, Nov. 1997, pp. 27-30.

Takuji Matsumoto, New Three-Dimensional Wafer Bonding Technology Using the Adhesive Injection Method, Mar., 1998, pp. 1217-1221, Jpn. J. Appl. Phys. vol. 37 (1998).

A. Fan, Copper Wafer Bonding, Electrochemical and Solid-State Letters, 1999, pp. 534-536, Cambridge, Massachusetts.

Victor W.C. Chan, Three Dimensional CMOS Integrated Circuits on Large Grain Polysilllcon Films, EEE, Hong Kong University of Science and Technology, 2000, pp. 00-161-00-164 Hong Kong.

K.W. Lee, Three-Dimensional Shared Memory Fabricated Using Wafer Stacking Technology, Dept. of Machine Intelligence and Systems Engineering, 2000, pp. 00-165-00-168, Hong Kong.

Kuan-Neng Chen, Microstructure Examination of Copper Wafer Bonding, Microsystem Technology Laboratories, Dec. 20, 2000, pp. 331-335, Cambridge, Massachusetts.

Y. Hayashi, S Wada, K. Kajiyana, K. Oyama, R. Koh, S. Takahashi. T. Kunio, Fabrication of Three-Dimensional IC Using "Cumlatively Bonded IC" (CUBIC) Technology, 1990, pp. 95-96, NEC Corporation, Shimokuzawa, Saganihara, Kanagawa 22, Japan.

* cited by examiner

MULTI-LAYER INTEGRATED SEMICONDUCTOR STRUCTURE HAVING AN ELECTRICAL SHIELDING PORTION

CROSS REFERENCE TO RELATED APPLICATION

This application claims the benefit under 35 U.S.C. §119(e) of U.S. Provisional Application No. 60/437,549, filed on Dec. 31, 2002, entitled, A Multi-Layer Integrated Semiconductor Structure, which is hereby incorporated by reference in its entirety.

STATEMENT REGARDING FEDERALLY SPONSORED RESEARCH

This invention was made with government support under a subcontract between Georgia Institute of Technology and M.I.T., under Prime Grant Number MDA972-99-1-0002, awarded by the Defense Advanced Research Projects Agency. The government has certain rights in the invention.

FIELD OF THE INVENTION

The present invention relates generally to a multi-layer integrated semiconductor structure and, more specifically, to a multi-layer integrated semiconductor structure that includes one or more electrical interference shielding portions. The purpose of such structures is to electrically isolate active devices fabricated in one semiconductor layer from those of another semiconductor layer of a multi-layer semiconductor structure.

BACKGROUND

The rapid scaling of CMOS technology and the push for higher levels of integration on a single chip have led to the necessity of placing entire systems on a chip (SOC). Wireless systems, in particular, rely on increased integration of the various components for performance enhancement. However, one of the most significant problems to the realization of an SOC is the parasitic interactions (e.g. electrical noise or interference) between large complex digital circuits and highly sensitive analog circuits. Performance of a wireless system is highly dependent on the ability to receive low-level signals while eliminating interfering signals. Substrate noise can be a significant interferer.

The noise coupling between the analog and digital components is a problem for mixed-signal integration. Three mechanisms govern substrate noise in integrated circuits. The first is the injection mechanism, whereby relatively large transient currents induced during digital switching work in tandem with circuit parasitics to induce noise on the power and ground lines as well as in the substrate. The second mechanism is propagation, for which noise travels from a noise generating element of the SOC through the common substrate to corrupt another element of the SOC, such as sensitive analog circuits. The third mechanism is reception, which explains how the noise couples to sensitive nodes. This occurs through source/drain capacitive coupling, power and ground bounce, and the backgate effect.

By breaking the resistive connection that is present as a result of the shared substrate, substrate noise can be significantly reduced. Three-dimensional integration is a technology whereby systems can be fabricated on separate wafers and subsequently bonded to form a single chip. Particularly noisy systems could be fabricated on a separate layer from more sensitive circuits thereby eliminating any noise propagation in the substrate.

The noise problem is mitigated in three-dimensional semiconductor structures; however, the problem is not completely solved. The three-dimensional semiconductor structure includes a number of individual integrated circuit structures which are stacked and bonded together. In the three-dimensional semiconductor structure, electrical noise or interference created by one device layer can be induced in the substrate of the adjacent layer due to the proximity of high-speed switching lines.

Therefore, it would be desirable to provide a structure that provides substantial shielding to electrical noise or interference communicated between adjacently bonded device layers of the three-dimensional semiconductor structure.

SUMMARY OF THE INVENTION

In accordance with the present invention, a multi-layer integrated semiconductor structure includes a first semiconductor layer that is composed of a number of active semiconductor devices that is separated from the second semiconductor layer also composed of active semiconductor devices by an interface whose purpose is two-fold: to electrically isolate the first layer from the second as well as to act as an interconnect layer.

With this particular arrangement, a multi-layer integrated semiconductor structure capable of having mixed-signal circuits is provided. The proposed isolation structure can be effectively integrated in a mixed-technology application. For example, the first semiconductor device layer may correspond to a digital technology; whereas, the second device layer is fabricated using an analog technology. The isolation structure would substantially reduce the interference generated by the digital layer and its effect on the sensitive analog circuits.

BRIEF DESCRIPTION OF THE DRAWING

The foregoing and other objects of this invention, the various features thereof, as well as the invention itself, can be more fully understood from the following description, when read together with the accompanying drawings in which.

DETAILED DESCRIPTION OF THE INVENTION

Figure 1:
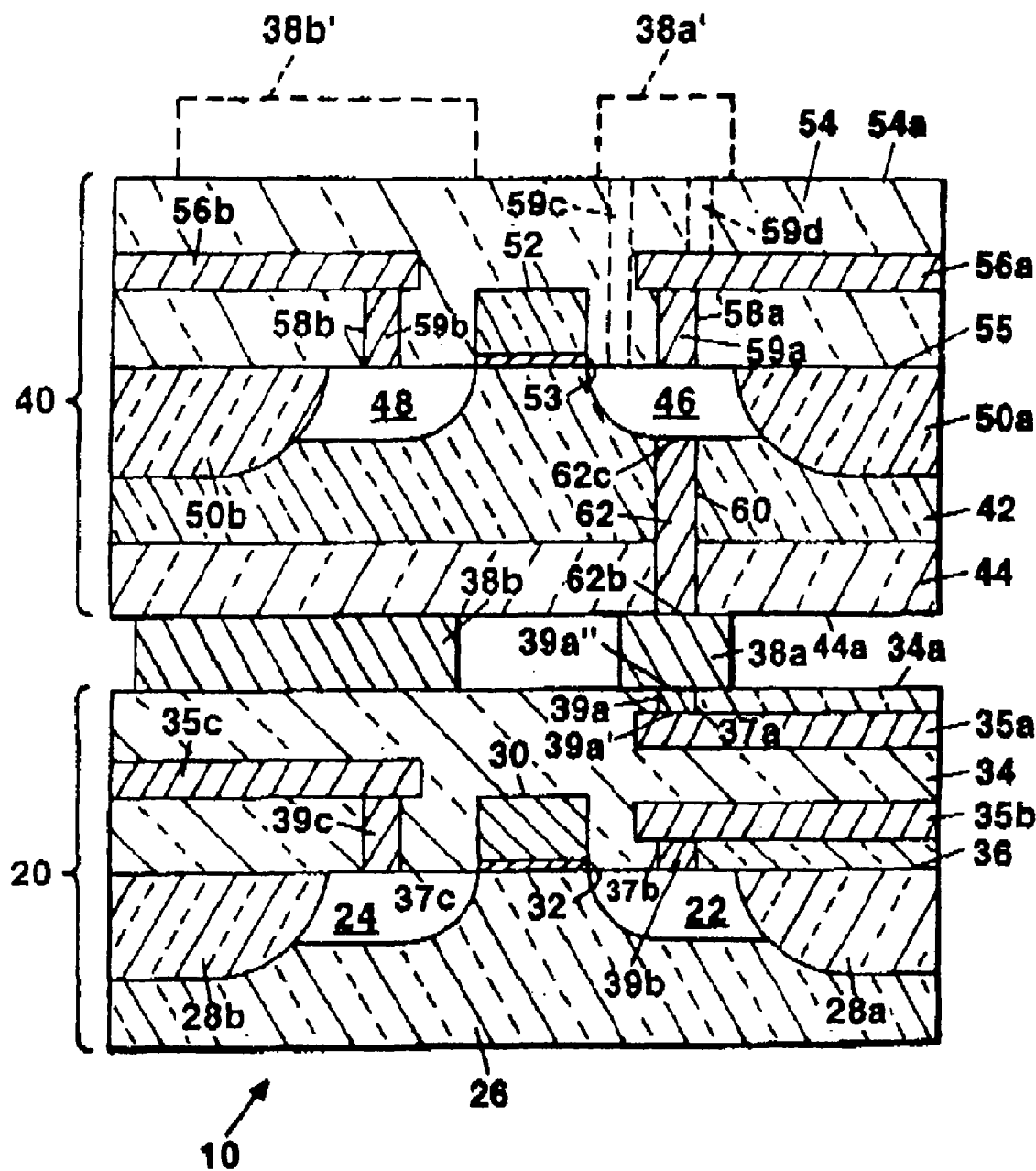
FIG. 1 is an exemplary cross-sectional view of a multi-layer integrated semiconductor structure including the electrical interference shielding structure according to the present invention.

Referring to FIG. 1, a multi-layer integrated semiconductor structure 10 includes at least a first device layer 20 and a second device layer 40. The first and second device layers (20 and 40 respectively) represent separate semiconductor device structures, each of which may include a number of layers. For example, the first device layer 20 may correspond to a first semiconductor wafer consisting of several semiconductor devices and metal interconnect layers while the second device layer 40 corresponds to a second semiconductor wafer consisting of several semiconductor devices and metal interconnect layers. In addition, device layers 20, 40 may also represent individual dies cut from a wafer. The first and second device layers 20, 40 are bonded together by first and second interface portions 38a, 38b. In one embodiment, the first interface portion 38a is employed for electrically connecting the first and second device layers 20, 40, while the second interface portion 38b is employed for providing electrical shielding to interference or cross-talk between the first and second device layers 20, 40. In a further embodiment, the second interface portion 38b can be grounded to provide further enhanced electrical shielding to interference or cross-talk between the first and second device layers 20, 40. The second interface portion 38b can be formed of a material that also serves to adhesively couple the first and second device layers 20, 40.

In one embodiment, the first and second interface portions 38a, 38b can be formed of a conductive bonding material, such as copper (Cu) or a Cu alloy or other suitably appropriate conductive and/or bonding materials. In other embodiments, the first interface portion 38a can be formed of a conductive material, as described above, and the second interface portion 38b can be formed of a dielectric material or other insulating material, which includes bonding and/or adhesive properties. In the exemplary embodiment, the first and second interface portions 38a, 38b are disposed on the top surface 34a of the dielectric material 34 prior to bonding the first and second device layers 20, 40. It should be noted that in other embodiments, the first and second interface portions 38a, 38b can be alternatively disposed on the bottom surface 44a of the insulating material 44 prior to coupling the first and second device layers 20, 40. In yet other embodiments, a portion of each of the first and second interface portions 38a, 38b can be disposed on both the top surface 34a of the dielectric material 34 and the bottom surface 44a of the insulating material 44 prior to coupling the first and second device layers 20, 40.

It should be understood that another first and second interface portions 38a', 38b' can be disposed on a top surface 54a of the second device layer 40, which are similar to the first and second interface portions 38a, 38b, as described above. In this arrangement, an additional device layer (not shown) can be stacked on top of the second device layer 40 in a similar manner as the second device layer 40 is stacked onto the first device layer 20. This process can be repeated to stack an infinite number of device layers (not shown) onto the previously defined top device layer for promoting semiconductor structure 10 scalability. The features of electrical shielding provided by the second interface portion 38b in accordance with embodiments of the present invention will be described in further detail below in connection with FIGS. 6–9.

The first device layer 20 includes a substrate 26 having a pair of doped regions 22, 24 formed therein. The doped regions 22, 24 can, for example, correspond to a source region 22 and a drain region 24 of a transistor. The first device layer 20 further includes insulating regions 28a, 28b. Insulating regions 28a, 28b can be provided, for example, as an oxide film disposed on the silicon substrate 26 adjacent to the doped regions 22, 24, respectively.

In the case where doped regions 22, 24 correspond to source and drain regions 22, 24, the first device layer 20 further includes a gate region 30 disposed over the silicon substrate 26 and a channel region defined between the source 22 and drain 24 regions. An insulating material 32, such as an oxide film, is provided between the gate region 30 and the silicon substrate 26. Thus, source, drain and gate regions 22, 24, 30 form the electrodes of a field effect transistor (FET).

It should be understood that although reference is made herein to specific types of circuit elements, such reference is made for convenience and clarity in the description and is not intended to be limiting. It should be appreciated that the device layer 20 typically includes thousands or millions of doped regions and that circuit elements other that FET's can be formed by doped regions.

One or more layers of dielectric material 34 are disposed over a top surface 36 of the first device layer for covering a myriad of the horizontally oriented interconnects or conductive circuit interconnects 35a, 35b, 35c, which are formed over the surface 36 of the first device layer 20. A plurality of vertically oriented via-holes 37a, 37b, 37c, are formed in the dielectric material 34. In one embodiment, the via-holes 37a, 37b, 37c may, for example, be filled with a conductive plug or material 39a, 39b, 39c, such as tungsten or copper.

The conductive plugs or material 39a, 39b, 39c are provided in the dielectric material 34 so as to interconnect one or more of the conductive circuit interconnects 35a, 35b, 35c to at least one of the source 22 or drain 24 regions of the first device layer 20 and/or to interconnect one or more of the conductive circuit interconnects 35a, 35b, 35c to the first conductive interface portion 38a.

The second device layer 40 includes a silicon substrate 42 having an insulating layer 44. Insulating layer 44 may be provided, for example, as an oxide layer. Similar to the first device layer 20, the second device layer 40 also includes a pair of doped regions 46, 48 which may, for example, correspond to source and drain regions 46, 48 formed in the silicon substrate 42. The second device layer 40 also includes insulating regions 50a, 50b. Insulating regions 50a, 50b may be provided, for example, as an oxide film, disposed on the silicon substrate 42 adjacent to the source 46 and drain 48 regions, respectively. Device layer 40 further includes a gate region 52 formed on the silicon substrate 42 over a channel region defined between the sources 46 and drains 48 regions. An insulating material 53, such as an oxide film, is provided between the gate region 52 and the silicon substrate 42.

One or more layers of dielectric material 54 are disposed over a surface 55 of the second device layer 40 for covering a plurality of the horizontally oriented interconnects or conductive circuit interconnects 56a, 56b, which are formed over the surface 55 of the second device layer 40. A plurality of vertically oriented via-holes 58a and 58b are formed in the dielectric material 54. In one embodiment, the via-holes 58a, 58b are each filled with a conductive material 59a, 59b, such as tungsten or copper. The via-holes 59a, 59b are arranged on the dielectric material 54 to interconnect the conductive circuit interconnects 56a, 56b to respective ones of the source 46 or drain 48 regions of the second device layer 40.

In the exemplary embodiment of FIG. 1, a first via-hole 37a of the plurality of vertically oriented via-holes 37a, 37b, 37c is provided in the dielectric material 34 of the first device layer 20. The first via-hole 37a extends from a top surface 34a of the dielectric material 34 downwardly to and exposes a portion of a first conductive interconnect 35a of the plurality of conductive interconnects 35a, 35b, 35c. The first via-hole 37a is dimensioned to accept a conductive plug 39a or other conductive material having a first end 39a' coupled to the first conductive interconnect 35a and a second end 39a" coupled to the first conductive interface portion 38a.

A second via-hole 60 provided in the second device layer 40 extends from a bottom surface 44a of the insulating material 44 upwardly through the silicon substrate 42 to expose a portion of the doped region 46 of the second device layer 40. The second via-hole 60 is dimensioned to accept a conductive plug 62 or other conductive material having a first end 62a coupled to the doped region 46 of the second device layer 40 and a second end 62b coupled to the first conductive interface portion 38a. In this arrangement, the first conductive plug 39a, the first conductive interface portion 38a and the second conductive plug 62 collectively provide a direct vertical interconnect between the first conductive interconnect 35a of the first device layer 20 and the doped region 46 of the second device layer 40.

Figure 2:
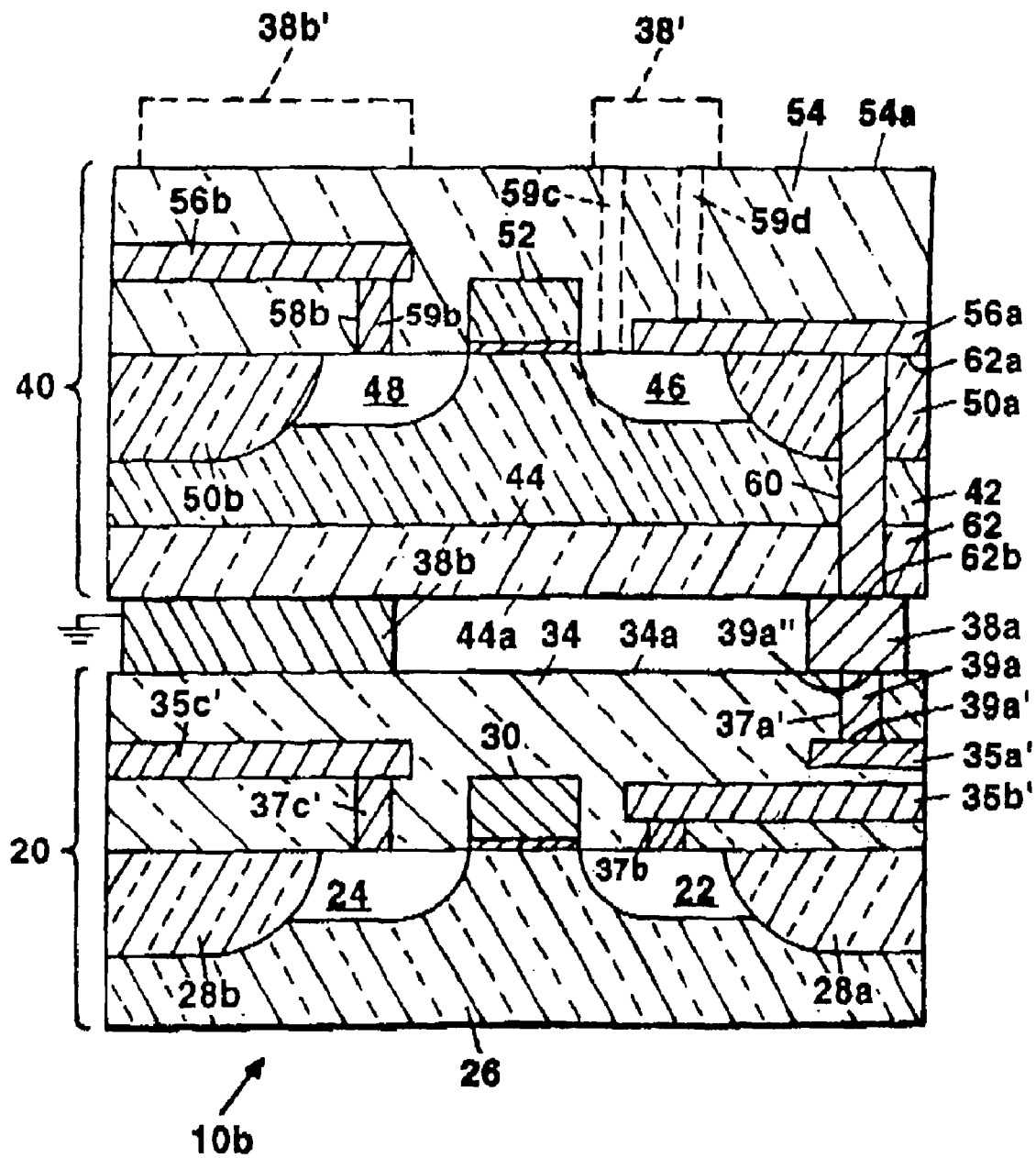
FIG. 2 is an exemplary cross-sectional view of another embodiment of a multi-layer integrated semiconductor structure including the electrical interference shielding portion, as shown in FIG. 1.

Referring to FIG. 2, in which like elements of FIG. 1 are provided having like reference designations, another exemplary embodiment of a multi-layer integrated semi-conductor structure 10b in accordance with the present invention, is shown. The multi-layer integrated semi-conductor structure 10b is similar to that described above in conjunction with FIG. 1.

In the multi-layer semiconductor structure 10b, a first via-hole 37a' extends from the top surface 34a of the dielectric material 34 downwardly to expose a portion of a first conductive interconnect 35a'. The first via-hole 37a' is dimensioned to accept a conductive plug 39a or other conductive material having a first end 39a' coupled to the first conductive interconnect 35a' and a second end 39a" coupled to the first conductive interface portion 38a.

A second via-hole 60 provided in the second device layer 40 extends from a bottom surface 44a of the insulating material 44 upwardly through the insulating material 44, the silicon substrate 42 and the insulating material 50a located adjacent the doped region 46 and exposes a portion of a first conductive interconnect 56a of the plurality of conductive interconnects 56a, 56b in the second device layer 40. The second via-hole 60 is dimensioned to accept a conductive plug 62 or other conductive material having a first end 62a coupled to the first conductive interconnect 56a and a second end 62b coupled to the first conductive interface portion 38a. In this arrangement, the first conductive plug 39a, the first conductive interface portion 38a and the second conductive plug 62 collectively provide a direct vertical interconnect between the first conductive interconnect 35a of the first device layer 20 and the first conductive interconnect 56a of the second device layer 40.

Figure 3:
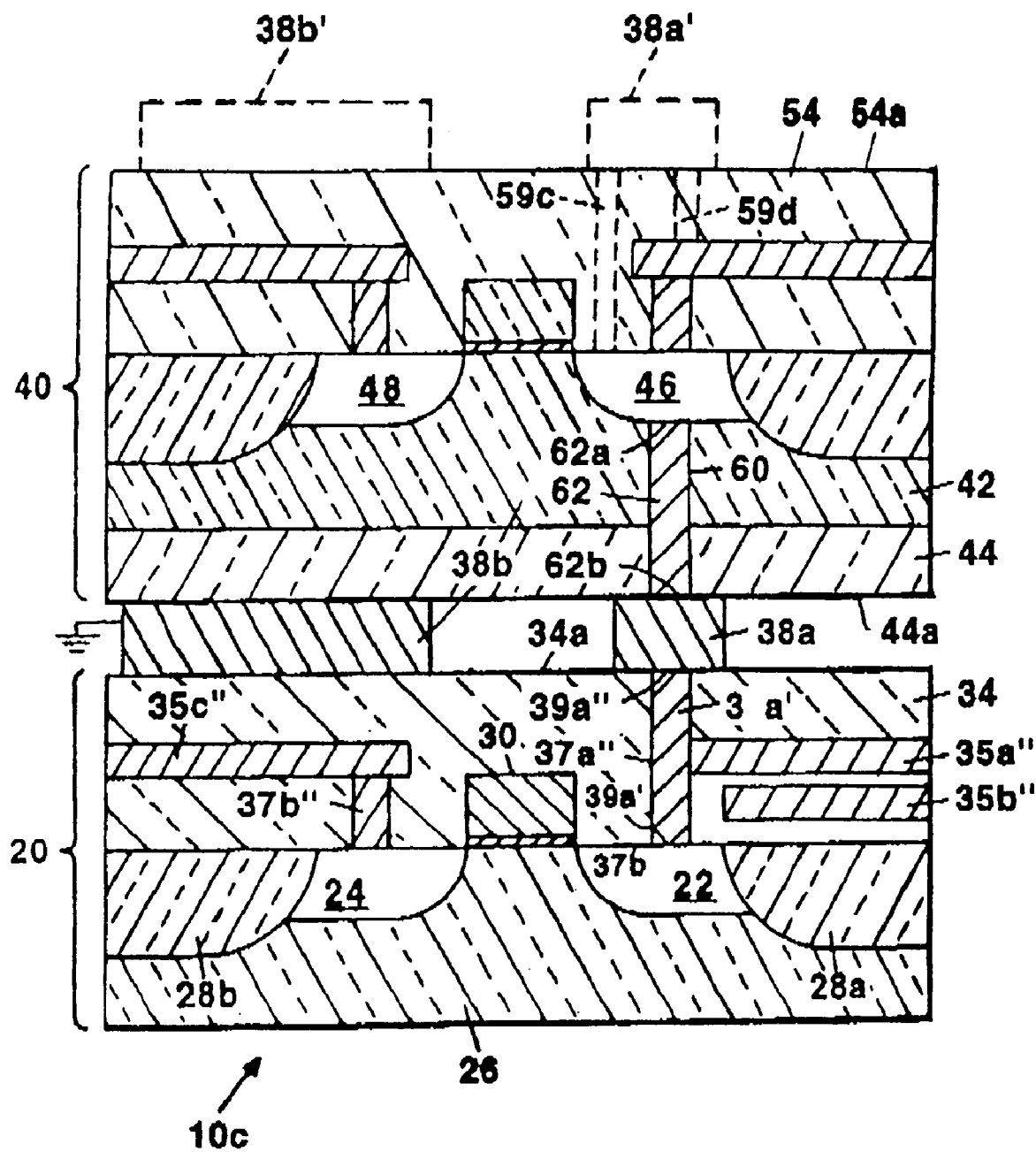
FIG. 3 is an exemplary cross-sectional view of yet another embodiment of a multi-layer integrated semiconductor structure including the electrical interference shielding portion, as shown in FIG. 1.

Referring to FIG. 3, in which like elements of FIGS. 1 and 2 are provided having like reference designations, another exemplary embodiment of a multi-layer integrated semiconductor structure 10c in accordance with the present invention is shown. The multi-layer integrated semiconductor structure 10c is similar to that described above in conjunction with FIGS. 1 and 2.

In the multi-layer semiconductor structure 10c, a first via-hole 37a" provided in the first device layer 20 extends from a top surface 34a of the dielectric material 34 downwardly to expose a portion of the doped region 22 of the first device layer 20. The first via-hole 37a" is dimensioned to accept a conductive plug 39a or other conductive material having a first end 39a' coupled to the doped region 22 and a second end 39a" coupled to the first conductive interface portion 38a. Furthermore, one or more of the plurality of conductive interconnects 35a", 35b", 35c", such as conductive interconnect 35a", can be coupled to the conductive plug 39a for providing an electrical signal path or other communication relationship between the conductive plug 39a and other elements (not shown), which may be located elsewhere in the structure 10C.

A second via-hole 60 provided in the second device layer 40 extends from the bottom surface 44a of the insulating material 44 upwardly through the insulating material 44 and through the substrate 42 to expose a portion of a doped region 46 of the second device layer 40. The second via-hole 60 is dimensioned to accept a conductive plug 62 or other conductive material having a first end 62a coupled to the region 46 of the second device layer 40 and a second end 62b coupled to the first conductive interface portion 38a. In this arrangement, the first conductive plug 39a, the first conductive interface portion 38a and the second conductive plug 62 collectively provide a direct vertical interconnect between the doped region 22 of the first device layer 20 and the doped region 46 of the second device layer 40.

Figure 4:
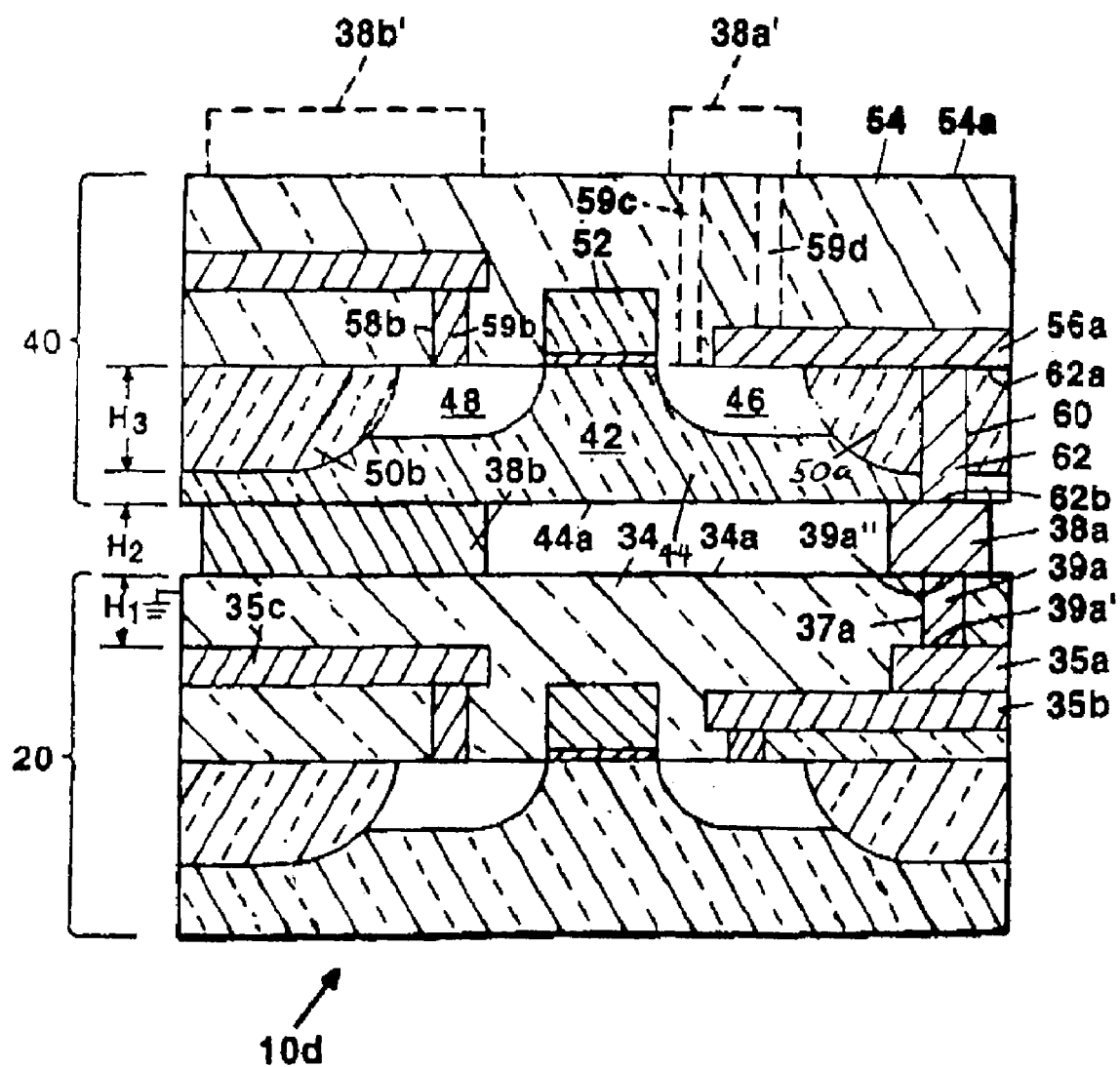
FIG. 4 is an exemplary cross-sectional view of yet another embodiment of a multi-layer integrated semiconductor structure including the electrical interference shielding portion, as shown in FIG. 1.

Referring to FIG. 4, in which like elements of FIGS. 1–3 are provided having like reference designations, another exemplary embodiment of a multi-layer integrated semiconductor structure 10d in accordance with the present invention is shown. The multi-layer integrated semiconductor structure 10d is similar to that shown and described above in conjunction with FIGS. 1–3.

In the multi-layer integrated semiconductor structure 10d, a first via-hole 37 provided in the dielectric material 34 and defined on first device layer 20 extends from the top surface 34a of the dielectric material 34 downwardly to expose a portion of a first conductive interconnect 35a. A height "$H_1$" of the dielectric material 34 of the first device layer 20 can be controlled to control the depth of the first via-hole 37a, which permits predetermined processing durations to be maintained during formation of the first via-hole 37a. The first via-hole 37a is dimensioned to accept a conductive plug 39a or other conductive material having a first end 39a' coupled to the first conductive interconnect 35a and a second end 39a" coupled to the first conductive interface portion 38a.

The second via-hole 60 is formed on the second device layer 40 and extends from the bottom surface 44a of the insulating material 44 upwardly through the insulating material 44, the silicon substrate 42 and the insulating material 50a located adjacent to the source region 46 for exposing a portion of a first conductive interconnect 56a located on the second device layer 40.

A height "$H_2$" of the insulating material 44 and a height "$H_3$" of the silicon substrate 42, which are both defined on the second device layer 40, can each be controlled to control the depth of the second via-hole 60, which permits predetermined processing durations to be maintained during formation of the second via-hole 60. The second via-hole 60 is dimensioned to accept a conductive plug 62 or other conductive material having a first end 62a coupled to the first conductive interconnect 56a and a second end 62b coupled to the first conductive interface portion 38a. In this arrangement, the first conductive plug 39a, the first conductive interface portion 38a and the second conductive plug 62 collectively provide a direct vertical interconnect between the first conductive interconnect 35a of the first device layer 20 and the first conductive interconnect 56a of the second device layer 40.

Figure 5:
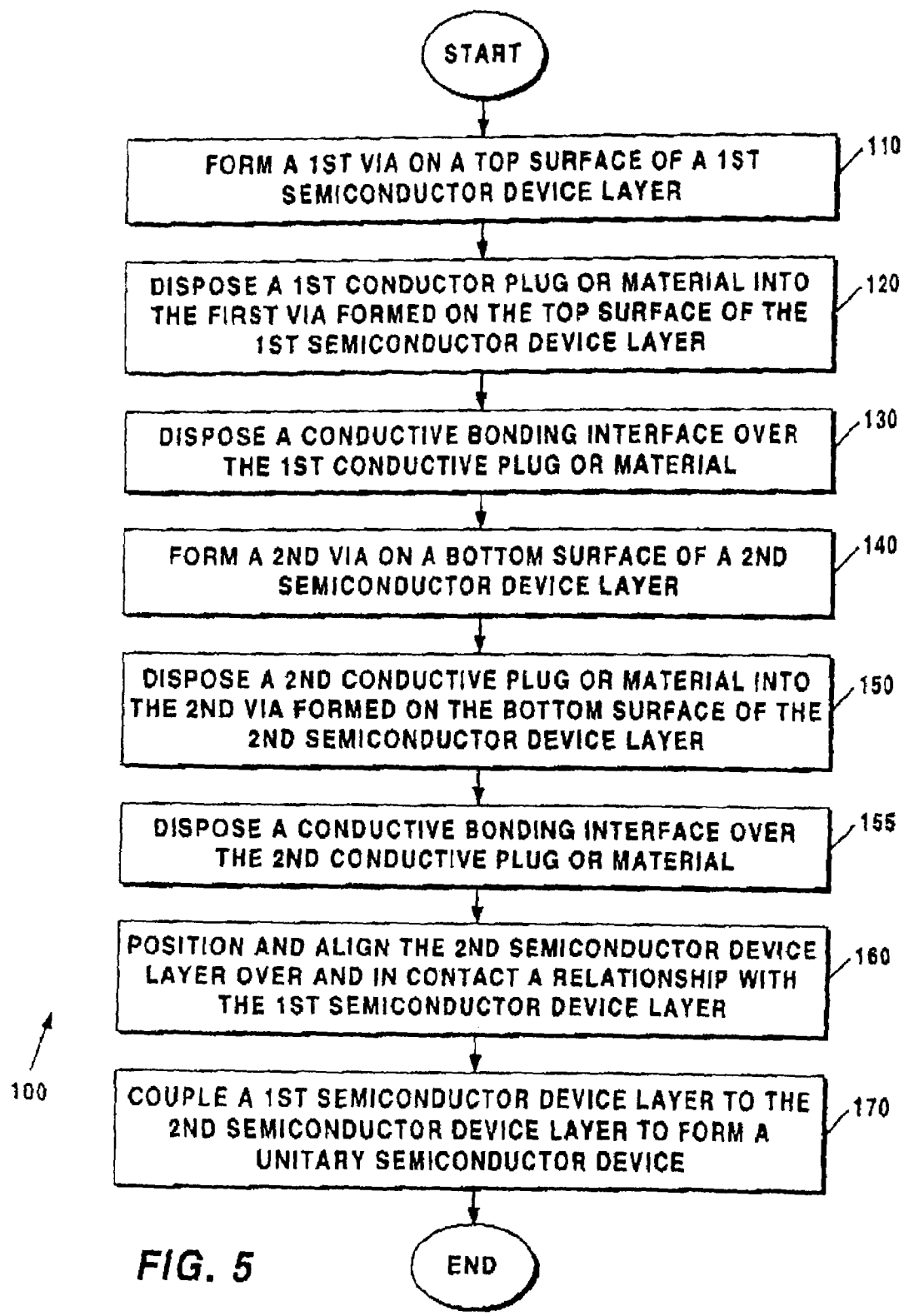
FIG. 5 is a flow chart illustrating process steps for fabricating the multi-layer integrated semiconductor structures of FIGS. 1–4.

Referring to FIG. 5, an exemplary method 100 of forming any one of the multi-layer integrated semiconductor structures 10 (FIG. 1), 10b (FIG. 2), 10c (FIG. 3) or 10d (FIG. 4) is shown. At step 110, a first device layer (e.g. device layer 20 shown in FIGS. 1–4 above) is processed to form at least a first via-hole (e.g. via-hole 37a shown above in FIG. 1) having a predetermined depth.

In one embodiment, the first via-hole 37a exposes a portion of a conductive metal member defined on the first device layer 20, such as the signal interconnect 35a.

In another embodiment, such as the embodiment shown in FIG. 3, one end of the first via-hole (e.g. via-hole 37a" in FIG. 3) extends downwardly from a first or top surface 34a of the device layer 20 (FIG. 3). The first via-hole extends downwardly a predetermined depth to expose a portion of a doped region 22 defined on the first device layer 20 (e.g. region 22 of device layer 20 in FIG. 3).

At step 120, a first conductive plug or material is disposed in the first via-hole formed on the top surface of the first device layer 20. At step 130, a conductive interface portion (e.g. first interface portion 38a in FIGS. 1–4), which may be provided, for example, as copper or copper alloy, is disposed over at least the first conductive plug.

At step 140, the method 100 further includes processing a second device layer (e.g. device layer 40 in FIG. 1) to form at least a second via-hole (e.g. via-hole 60 in FIG. 1) on a bottom surface thereof and having a predetermined depth. In one embodiment, the second via-hole exposes a portion of a doped region 46 defined on the second device layer 40 (e.g. source region 46 in FIGS. 1–4). In another embodiment, the second via-hole exposes a portion of a conductive metal line defined on the second device layer 40 (such as the signal interconnect 56a).

At step 150, a second conductive plug 62 or material is disposed in the second via-hole 60 formed on the bottom surface 44a of the second device layer 40. The second conductive plug can include similar material as the first conductive plug 39a.

At step 155, another conductive interface portion (not shown), which is similar to the first conductive interface 38a disposed on the first conductive plug, is disposed on at least the second conductive plug 62. This conductive interface portion disposed on the second conductive pug 62 combines with the first conductive interface 38a disposed on the first conductive plug when the first device layer 20 and the second device layer 40 are coupled together, which will be described in further detail below.

At step 160, the second device layer 40 is positioned and aligned over and in a contact relationship with the first device layer 20. At step 170, the first device layer 20 is coupled to the second device layer 40, via the first conductive interface portion 38a, to form a unitary multi-layer semiconductor device structure, such as the structures 10, 10b, 10c or 10d respectively depicted in FIGS. 1–4 above.

Although not specifically shown, it should be understood that the multi-layer semiconductor structures 10, 10b, 10c or 10d described above in conjunction with FIGS. 1, 2, 3 and 4, respectively are each scaleable to include a plurality of additional device layers (not shown), such as third and fourth device layers. In addition, it should be understood that the first device layer 20 can be constructed and arranged to operate as complex systems, such as digital signal processors (DSPs) and memories, as well as a number of other digital and/or analog based system. In addition, the first device layer 20 can be constructed and arranged to operate using optical components, such as optical cross-point switches and optical-to-electronic converters, as well as a number of other optical based devices. Furthermore, the first device layer 20 can be constructed and arranged to operate using micro-electromechanical (MEMS) components, such as micro-motors, sensors and actuators, as well as a number of other MEMS based devices.

It should be further understood that the second device layer 40 can be similarly constructed and arranged to operate as the first device layer 20, as described above. In one embodiment, the first device layer 20 and the second device layer 40 can each be constructed and arranged to operate using similar components and/or devices, as described above, to form a unitary multi-layer structure. In another embodiment, the first device layer 20 and the second device layer 40 can each be constructed and arranged to operate using dissimilar components and/or devices, as described above, to form a unitary mixed signal multi-layer structure.

Although the multi-layer semiconductor structures 10, 10b, 10c or 10d described above in conjunction with FIGS. 1, 2, 3 and 4, respectively represent the coupling of device layer 20 and device layer 40, it should be understood that in an exemplary embodiment, the device layer 20 can represent a single lower die element and the device layer 40 can represent a single upper die element. In this exemplary embodiment, the multi-layer semiconductor structures 10, 10b, 10c or 10d described above in conjunction with FIGS. 1, 2, 3 and 4, respectively show die-to-die bonding using the first conductive interface portion 38a to electrically couple the lower die element to the upper die element.

Furthermore, in another exemplary embodiment, the device layer 20 can represent one element of a plurality of elements located on a single lower semiconductor wafer (not shown) and the device layer 40 can represent one element of a plurality of elements located on a single upper semiconductor wafer (not shown). In this exemplary embodiment, the multi-layer semiconductor structures 10, 10b, 10c or 10d described above in conjunction with FIGS. 1, 2, 3 and 4, respectively show a portion of a wafer-to-wafer bonding using the first interface portion 38a to electrically couple one element of the plurality of elements of the lower wafer to one element of the plurality of elements of the upper wafer.

Figure 6:
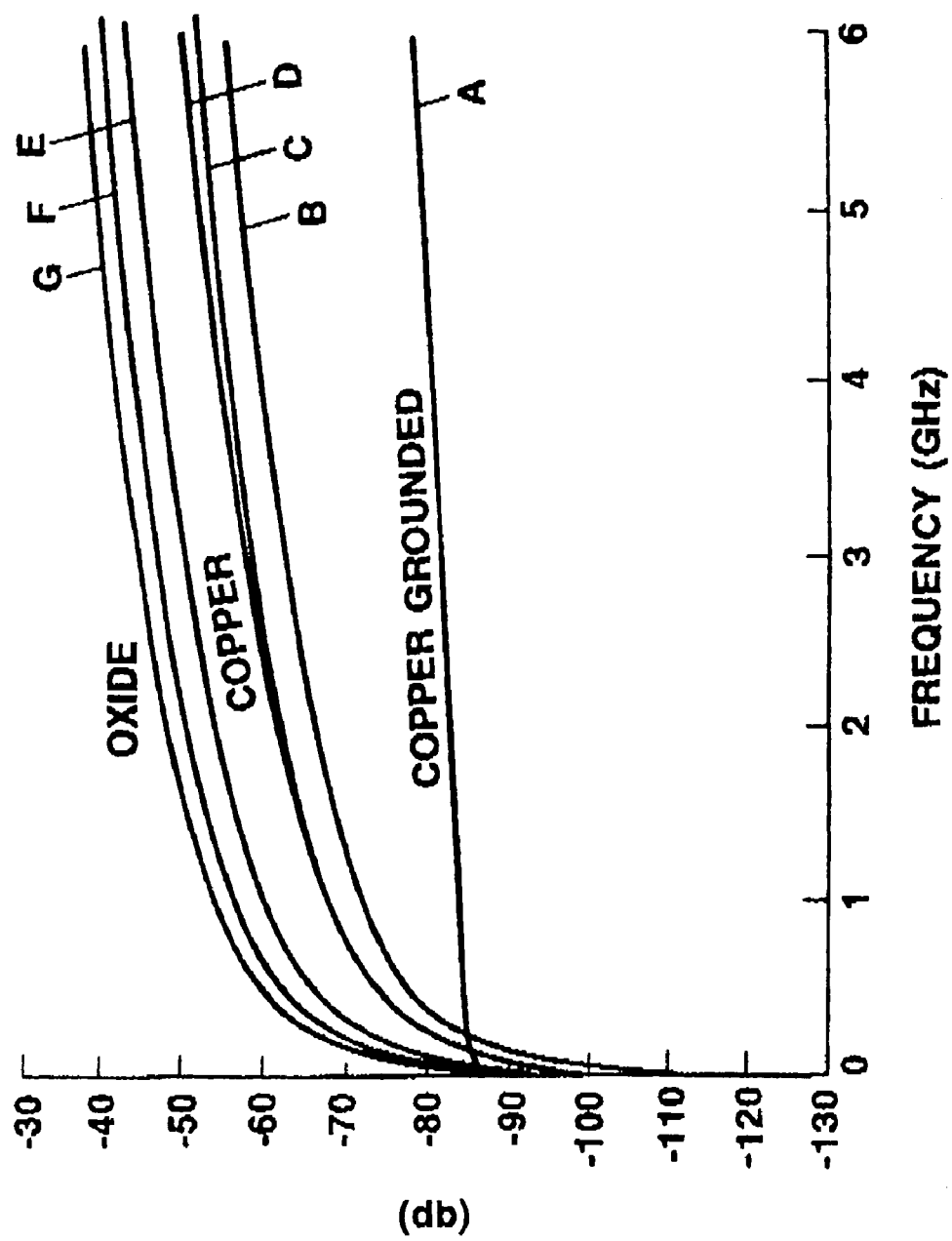
FIG. 6 shows a number of graphs representing levels of electrical isolation provided by various electrical interference shielding portions incorporated in the sample simulation structures of FIGS. 7–9.
Figure 7:
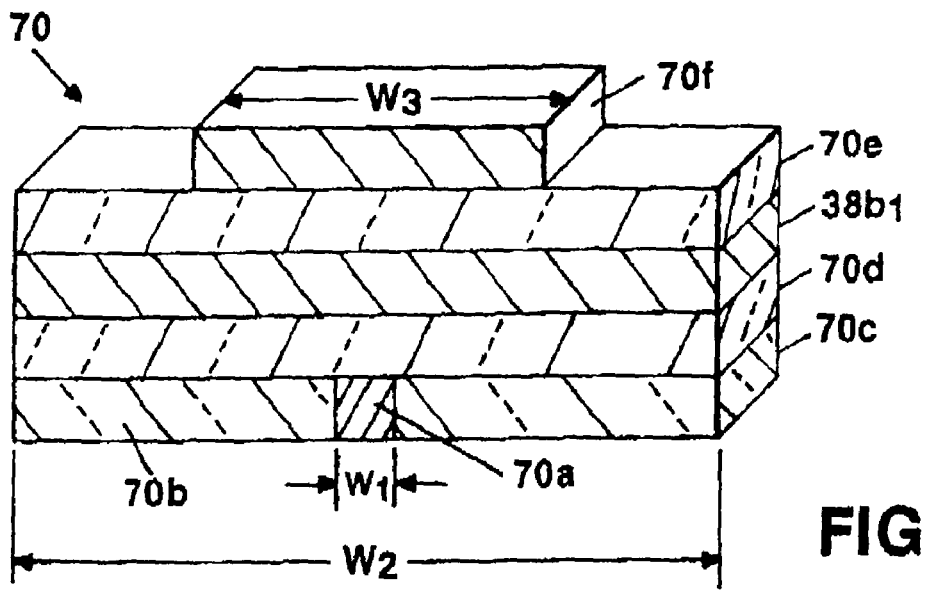
FIG. 7 is a first sample simulation structure including one variation of an electrical interference shielding portion.
Figure 8:
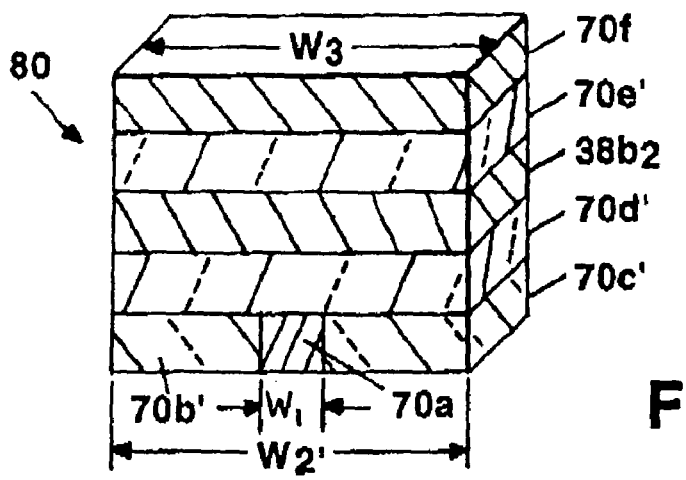
FIG. 8 is a second sample simulation structure including another variation of an electrical interference shielding portion.
Figure 9:
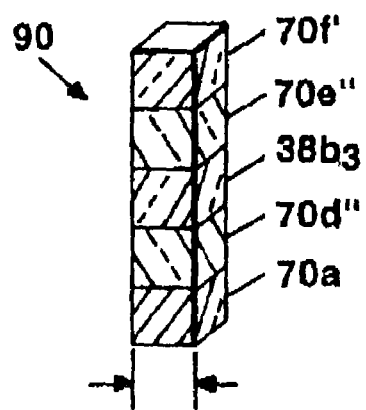
FIG. 9 is a third sample simulation structure including yet another variation of an electrical interference shielding portion.

Referring now to FIG. 6, shown are a number of graphs (e.g. A–G) representing a comparative analysis of electrical isolation levels between elements of a number of sample simulation structures 70, 80, 90, as shown in FIGS. 7–9, respectively. The curves of FIG. 6 further represent different electrical isolation levels sensed between elements of the sample simulation structures 70, 80, 90, when conductive or dielectric materials are used as interface portions $38b_1$, $38b_2$, $38b_3$ respectively shown in the sample simulation structures 70, 80, 90, of FIGS. 7–9, which will be described in further detail below. The curves of FIG. 6 are plotted as energy in decibels (dB) as a function of frequency in Giga-Hertz (GHz). It should be understood that the interface portions $38b_1$, $38b_2$, $38b_3$ are constructed and arranged to provide similar features as the second interface portion 38b represented throughout the various exemplary embodiments of the present invention shown in FIGS. 1–4.

Referring to FIGS. 6 and 7 collectively, the sample simulation structure 70 includes an electrically conductive structure 70a of predetermined width, "$W_1$." A pair of insulating portions 70b, 70c are disposed on adjacent sides of the conductive structure 70a. A third layer of insulating material 70d is disposed over the electrically conductive structure 70a and the first and second insulating portions 70b, 70c. The interface portion 38b, of width "$W_2$" is disposed over the third layer of insulating material 70d. A fourth layer of insulating material 70e is disposed over the interface portion $38b_1$ followed by the disposal of a conductive substrate 70f of width "$W_3$" over the fourth layer of insulating material 70e. In the sample simulation structure 70, the interface portion $38b_1$ serves to provide electrical shielding and/or isolation between the electrically conductive structure 70a and the conductive substrate 70f.

In the exemplary embodiment, the width $W_1$ of the electrically conductive structure 70a is approximately 1 μm; the width $W_2$ of the interface portion $38b_1$ is approximately 100 μm and the width $W_3$ of the conductive substrate 70f is approximately 20 μm with a resistivity of approximately 10 Ωcm.

Isolation between two ports with the transmission coefficient S21 where port 1 is structure 70a, and port 2 is structure 70f. The S21 data for sample simulation structure 70 is shown in curve "A" of FIG. 6, which represents the electrical interference or cross-talk level sensed between the conductive structure 70a (FIG. 7) and the conductive substrate 70f (FIG. 7) when grounded Cu-material is used as the interface portion 38b (FIG. 7). The interface portion is not limited to Cu. Other conductive materials provide the same S21 characteristics. For the purposes of the analysis, copper was chosen as an exemplary interface material. When the Cu-material used as the interface portion 38b of structure 70 is left floating, the electrical interference or cross-talk sensed between the conductive structure 70a and the conductive substrate 70f is depicted in FIG. 7 by curve B. Further, replacing the Cu material of the interface portion 38b, with an oxide or other insulating material and re-executing the S21 simulation test on the sample simulation structure 70 provides the curve "G" in FIG. 6, which represents an electrical interface or cross-talk level sensed between the electrically conductive structure 70a and the conductive substrate 70f.

In inspecting graphs A, B and G, it should be understood that using grounded Cu as the interface portion $38b_1$ provides a relatively greater shielding to electrical interference or cross-talk (e.g. graph A) than using oxide or the other insulating materials as the interface portion $38b_1$ (e.g. graph G). Furthermore, when ungrounded Cu material is used as the interface portion $38b_1$, approximately a 15 dB of isolation improvement is realized (e.g. graph B), as opposed to using oxide material or other insulating material as the interface portion $38b_1$ (e.g. graph G).

Prior to these simulations, it was believed that there would be no improvement in isolation when interchanging between using Cu or another conductive material and oxide materials as the interface portion $38b_1$. When oxide material is used as the interface portion $38b_1$, the coupling between the electrically conductive structure 70a and the conductive substrate 70f is formed via a single capacitance formed between the conductive structure 70a and the conductive substrate 70f, where the insulating material 70d, interface portion $38b_1$, and insulating layer 70e serve as interlayer dielectrics of the capacitance.

When a conductive material such as Cu is used as the interface portion $38b_1$, the coupling between the electrically conductive structure 70a and the conductive substrate 70f is formed via two series capacitances. The first capacitance is formed between the conductive structure 70a and interface portion $38b_1$ while the second capacitance is formed between the interface portion $38b_1$ and the conductive substrate 70f. Further, the insulating materials 70d, 70e, respectively serve as interlayer dielectrics for the first and second capacitances. Employing a simple parallel plate model, the effective capacitance between the conductive structure 70a and the conductive substrate 70f should be almost the same regardless of whether Cu or oxide is used as the interface portion $38b_1$. However, as represented in FIG. 6 by the graphs B and G, this is not the case since the graph B includes a relatively lower dB level (e.g. 15 dB relatively lower cross-talk level between the conductive structure 70a and the conductive substrate 70f) and the graph G includes a relatively higher dB level (e.g. 15 dB relatively higher cross-talk level between the conductive structure 70a and the conductive substrate 70f).

The role of fringing fields greatly affects the capacitance between the conductive structure 70a and the conductive substrate 70f and varies depending on the material used for the interface portion $38b_1$. Since the interface portion $38b_1$ of the sample simulation structure 70 is significantly larger than both the conductive structure 70a and the conductive substrate 70f, large fringing fields exist between the conductive structure 70a and the conductive substrate 70f. When Cu is used as the interface portion $38b_1$, the overall capacitance of the sample simulation structure 70 will be dominated by the smaller capacitance of the first and second capacitances, as described above.

More precisely and with respect to the first series capacitance, which is defined between the conductive structure 70a and the interface portion $38b_1$, the first capacitance will be largely determined by the area of the conductive structure 70a, because the conductive structure 70a is two orders of magnitude smaller than the interface portion $38b_1$. Accordingly, the first capacitance is approximately two orders of magnitude smaller than the second capacitance, which is defined between the interface portion $38b_1$ and the conductive substrate 70f. Therefore, the first capacitance dominates the effective capacitance between the conductive structure 70a and the conductive substrate 70f. The significantly smaller first capacitance, as described above, which is present in structure 70 when Cu is used as the interface portion $38b_1$, accounts for the 15 dB difference in the S21 test simulation.

Referring to FIGS. 6 and 8 collectively, to further validate this theory, the S21 simulation is executed on the sample simulation structure 80 (FIG. 8). The sample simulation structure 80 includes similar layers and/or portions as described above with respect to FIG. 7, however, the width $W_2$' (FIG. 8) of the interface portion $38b_2$ (FIG. 8) is reduced. In particular, the width $W_2$' of the interface portion $38b_2$ is reduced to be similar to the width $W_3$ (FIG. 8) of the conductive substrate 70f (FIG. 8), which reduces the effect of fringing fields when oxide is used as the interface portion $38b_2$ and which increases the coupling capacitance when Cu is used as the interface portion $38b_2$.

As predicted by the theory above, when using oxide for the interface portion $38b_2$, the S21 simulation provides graph "F" in FIG. 6, which represents an improvement in the interference or cross-talk sensed between the conductive structure 70a (FIG. 8) and the conductive substrate 70f (FIG. 8). On the other hand, when using Cu for the interface portion 38$b_2$, the S21 simulation provides graph "C" in FIG. 6, which represents an increase or worsening in the level of interference or cross-talk sensed between the conductive structure 70a and the conductive substrate 70f.

Referring to FIGS. 6 and 9 collectively, the sample simulation structure 90 (FIG. 9) includes substantially equivalent layers and/or portions as described above in detail with respect to FIG. 7, however, the insulating layer 70d'' (FIG. 9), the interface portion 38$b_3$ (FIG. 9), the insulating layer 70e'' (FIG. 9) and the conductive substrate 70f (FIG. 9) are all reduced to the width $W_1$ (FIG. 9) of the conductive structure 70a (FIG. 9), which in the exemplary embodiment is approximately equal to 1 µm.

As further predicted by the theory above, when using oxide material for the interface portion 38$b_3$ (FIG. 9), the S21 simulation provides graph "E" in FIG. 6, which represents a further improvement in the interference or cross-talk realized between the conductive structure 70a and the conductive substrate 70f (FIG. 9). On the other hand, when using Cu material for the interface portion 38$b_3$ (FIG. 9), the S21 simulation provides graph "D" in FIG. 6, which represents a continued worsening in the level of interference or cross-talk sensed between the conductive structure 70a and the conductive substrate 70f.

Although, the above described interface portion 38b incorporated in FIGS. 1–4 and the variations thereof 38$b_1$, 38$b_2$, 38$b_3$ incorporated in FIGS. 7–9 have been shown and described as including conductive materials, such as Cu, as well as insulating materials, such as oxide, it should be understood that the interface portions 38b and variations thereof 38$b_1$, 38$b_2$, 38$b_3$ can include a number of other materials, compounds or alloys that provide shielding properties to electrical interference or cross-talk between elements of the multi-layer integrated semiconductor structures 10, 10b, 10c, 10d (FIGS. 1–4). It should be further understood that the interface portions 38b and variations thereof 38$b_1$, 38$b_2$, 38$b_3$ can include a number of other dimensions not specifically shown herein, which provide shielding properties to electrical interference or cross-talk between elements of the multi-layer integrated semiconductor structures 10, 10b, 10c, 10d (FIGS. 1–4).

Having thus described at least one illustrative embodiment of the invention, various alterations, modifications and improvements will readily occur to those skilled in the art. Such alterations, modifications and improvements are intended to be within the scope and spirit of the invention. Accordingly, the foregoing description is by way of example only and is not intended as limiting. The invention's limit is defined only in the following claims and the equivalents thereto. All references and publications cited herein are expressly incorporated herein by reference in their entirety.

What is claimed is:

1. A multi-layer integrated semiconductor structure, comprising:
   a first semiconductor structure comprising a first surface and semiconductor elements associated with a first semiconductor signaling technology;
   a second semiconductor structure comprising a second surface and semiconductor elements associated with a second semiconductor signaling technology; and
   an interface disposed between the first surface and the second surface, the interface comprising a first portion adapted to provide a communication interface between the first and second semiconductor structures and a second portion adapted to reduce electrical interference between signals propagating along the first and second semiconductor structures, the second portion being directly coupled to the first surface and the second surface, at least one of the first and second interface portions corresponding to a conductive bonding interface which secures the first surface of the first semiconductor structure to the first surface of the second semiconductor structure.

2. The multi-layer integrated semiconductor structure of claim 1, wherein the first portion of the interface includes an electrically conductive adhesive material securing the first surface to the second surface.

3. The multi-layer integrated semiconductor structure of claim 1, wherein the first portion of the interface includes an electrically conductive material.

4. The multi-layer integrated semiconductor structure of claim 1, wherein the second portion of the interface includes an electrically conductive adhesive material.

5. The multi-layer integrated semiconductor structure of claim 4, wherein the electrically conductive adhesive material is grounded.

6. The multi-layer integrated semiconductor structure of claim 5, wherein the electrically conductive adhesive material includes at least one of copper, gold, aluminum or a metal alloy.

7. The multi-layer integrated semiconductor structure of claim 1, wherein the second portion of the interface includes a dielectric adhesive material.

8. The multi-layer integrated semiconductor structure of claim 7, wherein the dielectric adhesive material includes an organic material.

9. The multi-layer integrated semiconductor structure of claim 7, wherein the dielectric adhesive material includes an inorganic material.

10. The multi-layer integrated semiconductor structure of claim 1, wherein the first semiconductor signaling technology includes digital signaling related technology.

11. The multi-layer integrated semiconductor structure of claim 1, wherein the second semiconductor signaling technology includes analog signaling related technology.

12. The multi-layer integrated semiconductor structure of claim 1, wherein the first and second interface portions are provided from an electrically conductive adhesive adapted to adhesively couple the first surface to the second surface.

13. The multi-layer integrated semiconductor structure of claim 12, wherein the first surface corresponds to a top surface of the first semiconductor structure.

14. The multi-layer integrated semiconductor structure of claim 13, wherein the second surface corresponds to a bottom surface of the second semiconductor structure.

15. The multi-layer integrated semiconductor structure of claim 13, wherein the second surface corresponds to a top surface of the second semiconductor structure.

16. The multi-layer integrated semiconductor structure of claim 12, wherein the first surface corresponds to a bottom surface of the first semiconductor structure.

17. The multi-layer integrated semiconductor structure of claim 16, wherein the second surface corresponds to a top surface of the second semiconductor structure.

18. The multi-layer integrated semiconductor structure of claim 16, wherein the second surface corresponds to a bottom surface of the second semiconductor structure.

19. The multi-layer integrated semiconductor structure of claim 1, wherein both the first and second portions of said interface are provided from an electrically conductive bonding material.

* * * * *

UNITED STATES PATENT AND TRADEMARK OFFICE
CERTIFICATE OF CORRECTION

| | |
|---|---|
| PATENT NO. | : 7,067,909 B2 |
| APPLICATION NO. | : 10/749096 |
| DATED | : June 27, 2006 |
| INVENTOR(S) | : Reif et al. |

It is certified that error appears in the above-identified patent and that said Letters Patent is hereby corrected as shown below:

Column 4, line 29 delete "other that" and replace with --other than--.

Column 4, lines 59-60 delete "sources 46 and drains 48" and replace with --source 46 and drain 48--.

Column 7, line 56 delete "pug 62" and replace with --plug 62--.

Column 8, line 16 delete "system." and replace with --systems.--.

Column 9, line 11 delete "38b," and replace with --$38b_1$,--.

Column 9, line 42 delete "38b," and replace with --$38b_1$,--.

Signed and Sealed this

Twentieth Day of May, 2008

JON W. DUDAS
*Director of the United States Patent and Trademark Office*